United States Patent
Duranton

(10) Patent No.: US 6,807,604 B2
(45) Date of Patent: Oct. 19, 2004

(54) METHOD OF REFRESHING A DYNAMIC MEMORY

(75) Inventor: Marc Duranton, Suresnes (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 167 days.

(21) Appl. No.: 10/077,061

(22) Filed: Feb. 15, 2002

(65) Prior Publication Data

US 2002/0116572 A1 Aug. 22, 2002

(30) Foreign Application Priority Data

Feb. 16, 2001 (FR) .............................. 01 02136

(51) Int. Cl.⁷ .............................................. G06F 12/00
(52) U.S. Cl. ...................... 711/106; 711/105; 365/149; 365/183; 365/222
(58) Field of Search ................................ 711/106, 105; 365/149, 183, 222

(56) References Cited

U.S. PATENT DOCUMENTS 5,148,546 A    9/1992   Blodgett 6,167,484 A  * 12/2000   Boyer et al. ................. 711/106

* cited by examiner

*Primary Examiner*—Donald Sparks
*Assistant Examiner*—Bao Truong
(74) *Attorney, Agent, or Firm*—Edward W. Goodman

(57) ABSTRACT

A method of refreshing a dynamic memory intended for storing variables involved in operations performed by a processor, includes a step of planning 10 in the course of which an order and a timing of the operations are established, a step of estimating 13 a retention time specific to each variable, a step of forecasting 14 at least one instant at which each variable must be refreshed, a step of placement 15 in the course of which the variables are placed in the memory, a step of refreshing 16 in the course of which the variables are refreshed at the instants defined during the forecasting step 14. The method allows a reduction in the latency times and in the consumption of current which are related to the refreshing. It is of particular benefit in systems where the real time constraint is important, for example, video data processing systems.

5 Claims, 6 Drawing Sheets

METHOD OF REFRESHING A DYNAMIC MEMORY

BACKGROUND OF THE INVENTION

1. Field of the Invention

The invention relates to a method of refreshing a dynamic memory intended for storing variables involved in operations performed by a processor. The invention finds application, for example, in a programmable system dedicated to an application with real-time type constraints, such as a video data processing system.

2. Description of the Related Art

In integrated circuits, processing of signals requires ever greater storage capacity. To increase this storage capacity, embedded memories are often used. There are two types of such memories:

- static memories, such as static random access memories (SRAMs).
- dynamic memories, such as dynamic random access memories (DRAMs).

Static memories are constructed from flip-flops. When a data item is stored in a static memory, this data item remains stored for as long as the circuit containing the static memory is energized. Dynamic memories store the data in the form of a capacitor charge. On account of leakage currents causing losses of charge, it is necessary for these capacitors to be frequently recharged so as to keep the data in memory. This operation is called the refreshing of a data item, and must be performed, depending on the memories used, approximately every 1 to 10 milliseconds. The duration for which a data item can be kept in memory without requiring refreshing is called the "retention time", and is specific to the data item considered. However, dynamic memories are used on account of their large storage capacity. Specifically, to store a data bit, a dynamic memory requires a single transistor while a static memory requires from 4 to 6 transistors. For the same storage capacity, a dynamic memory thus appears to be less expensive than a static memory. However, the refreshing of the data required by a dynamic memory introduces a non-negligible latency time, during which a processor cannot have access to the data stored in the memory. Specifically, the refresh is performed systematically on all the data contained in the dynamic memory, which requires a considerable amount of time.

In order to remedy this drawback, U.S. Pat. No. 5,148,546 discloses a method making it possible to dynamically determine the memory addresses of the data to be refreshed, so as to refresh, at a given instant, only the data requiring refreshing. Thus, at this given instant, a large number of data items is accessible to the processor, since these data are not monopolized by the refresh circuit, and this results, averaged over time, in a reduction in the latency time. However, this method requires the installation of a subsystem in the circuit, so as to determine the memory addresses of the data to be refreshed. Furthermore, this method does not allow a large reduction in the latency time, since the dynamic determination of the memory addresses of the data to be refreshed also requires a certain amount of time.

SUMMARY OF THE INVENTION

It is an object of the invention to provide a method making it possible to reduce the latency time due to refreshing in a dynamic memory.

According to the invention, a method of refreshing a dynamic memory as defined in the opening paragraph is characterized in that it comprises the steps:

planning an order and a timing of said operations;

estimating a retention time specific to each variable;

forecasting at least one instant at which each variable must be refreshed, an instant at which a given variable must be refreshed being defined as a function of the retention time of said given variable and the timing of the operations in which said given variable is involved;

placing said variables are placed in said memory; and refreshing said variables at the instants defined during the forecasting step.

The invention exploits the fact that in certain programmable systems, it is possible to ascertain, when compiling a program defining the operations to be performed by the processor, the order of these operations, the timing of these operations and the variables involved in these operations. Moreover, since the retention time specific to a variable is related to the technology used for the fabrication of the dynamic memory, the estimation of this retention time exhibits no difficulties. Thus, having ascertained the instant at which a variable is created, the instant at which this variable is used in an operation and the retention time for this variable, it is possible to forecast the instant at which this variable must be refreshed. Additionally, by placing the variables judiciously in memory, so that the variables which have to be refreshed at the same instant are located, for example, in one and the same area of the memory, it is possible to decrease the latency time due to the refreshing of the dynamic memory. Furthermore, since the refreshing of a variable can be performed by a reading of this variable by the processor, this method does not require the addition of any refresh circuit, i.e., the processor is able to manage the refreshing of the dynamic memory on its own.

In so far as the steps described hereinabove may be performed by software, the invention also provides for a computer program comprising program code instructions for the execution of the steps of the method described hereinabove when said program is executed on a computer.

BRIEF DESCRIPTION OF THE DRAWINGS

The invention will be better understood and other details will become apparent in the description which follows, in conjunction with the appended drawings which are given by way of non-limiting examples, and in which.

DESCRIPTION OF THE PREFERRED EMBODIMENTS

Figure 1:
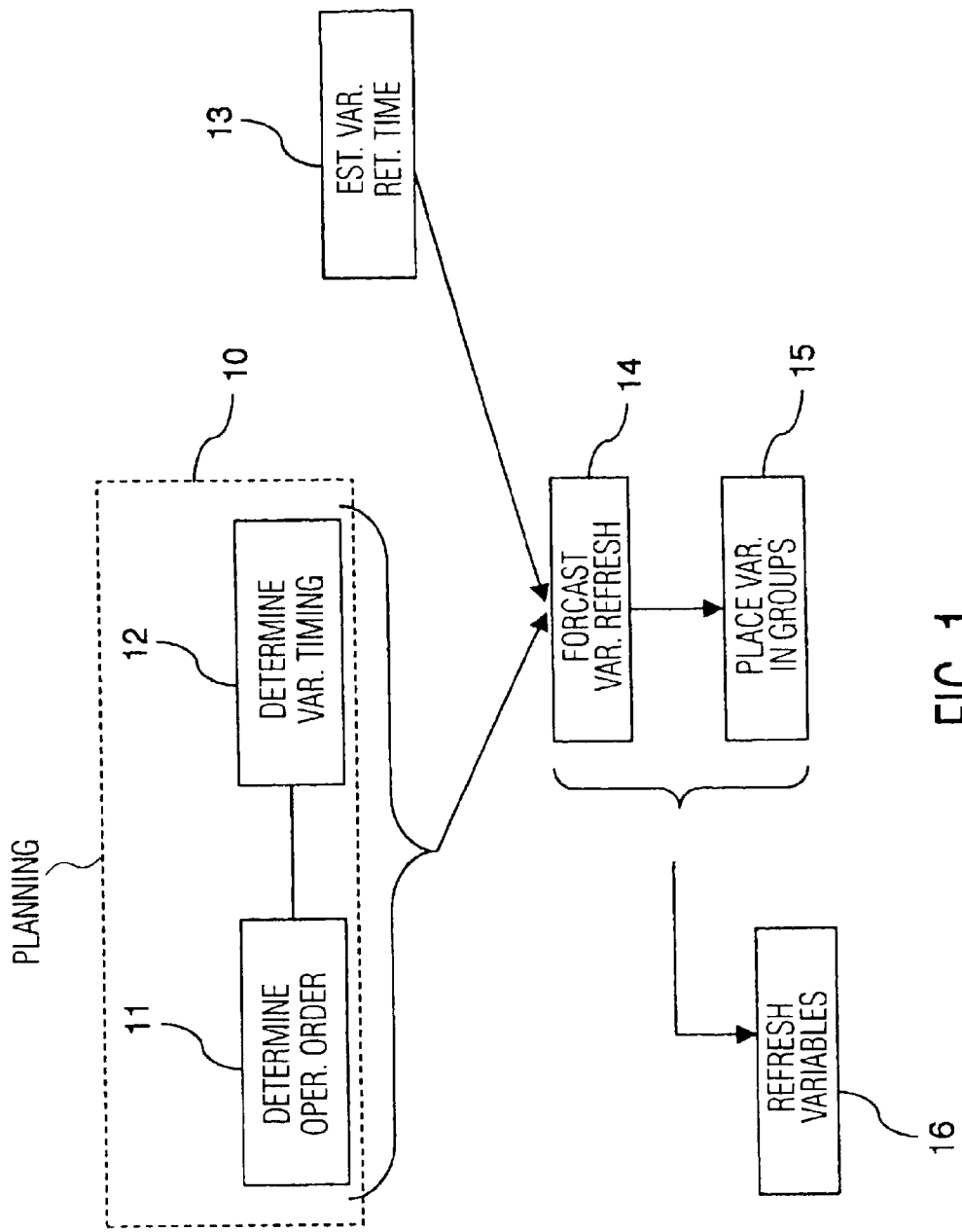
FIG. 1 is a block diagram illustrating characteristics of the invention.

FIG. 1 illustrates characteristics of the invention. A method of refreshing a dynamic memory according to the invention comprises a planning step 10 comprising a sub-step 11 for determining the order of the operations, and a timing sub-step 12, a step 13 for estimating the retention time of the variables, a step 14 for forecasting the instants at which the variables must be refreshed, a placement step 15 and a refresh step 16. In a particularly advantageous mode of implementation of the invention, the operations to be performed by a processor constitute a program, wherein the steps of planning 10, of estimating 13 the retention time of the variables, of forecasting 14 and of placement 15, are performed by the processor when compiling this program.

When compiling the program, the processor determines, during the sub-step 11, for determining the order of the operations, all the operations which will be performed by the program, the order in which these operations will be performed, as well as the different variables involved in these operations. During the timing sub-step 12, the processor determines the instants at which the variables will be created, the instants at which the variables will be used to perform the various operations, and the instants onward of which certain variables will no longer be used. These two sub-steps are particularly easy to implement in programmable systems, such as a system dedicated to an application with real-time type constraints. Specifically, in these systems, all the operations as well as their timing are known when compiling the program, and not dynamically when executing the program, as is the case in certain other data processing systems.

The step 13, for estimating the retention time of the variables, makes it possible to ascertain the duration onward of which a data item stored in memory will no longer be usable by the processor in the absence of a refresh. As a function of the results of the planning step 10 and of the step 13 for estimating the retention time of the variables, the forecasting step 14 makes it possible to determine the instants at which the variables will have to be refreshed. It should be noted that the forecasting step 14 can also take into account the states of the refresh device, which will be detailed in FIG. 5. The placement step 15 makes it possible, in particular, to group together the variables which have to be refreshed at similar instants in one and the same area of the dynamic memory. It should be noted that this placement step 15 can also be performed in a different way, for example, without taking account of the results of the forecasting step 14. It is, for example, possible to envisage placing the variables randomly in the dynamic memory. The advantage of a judicious grouping together of the variables as a function of the results of the forecasting step 14 is that this makes it possible to decrease the duration of the refresh, hence to reduce the latency times. The refreshing step 16 makes it possible to refresh variables at the instants defined by the forecasting step 14. In this particularly advantageous mode of implementation of the invention, the refreshing step 16 is performed by the processor, by virtue of a reading of the variable to be refreshed. The refreshing step 16 can also be performed by virtue of a reading and a writing of the variable to be refreshed, which are carried out by the processor, or optionally by virtue of a refresh circuit external to the processor.

Figure 2:
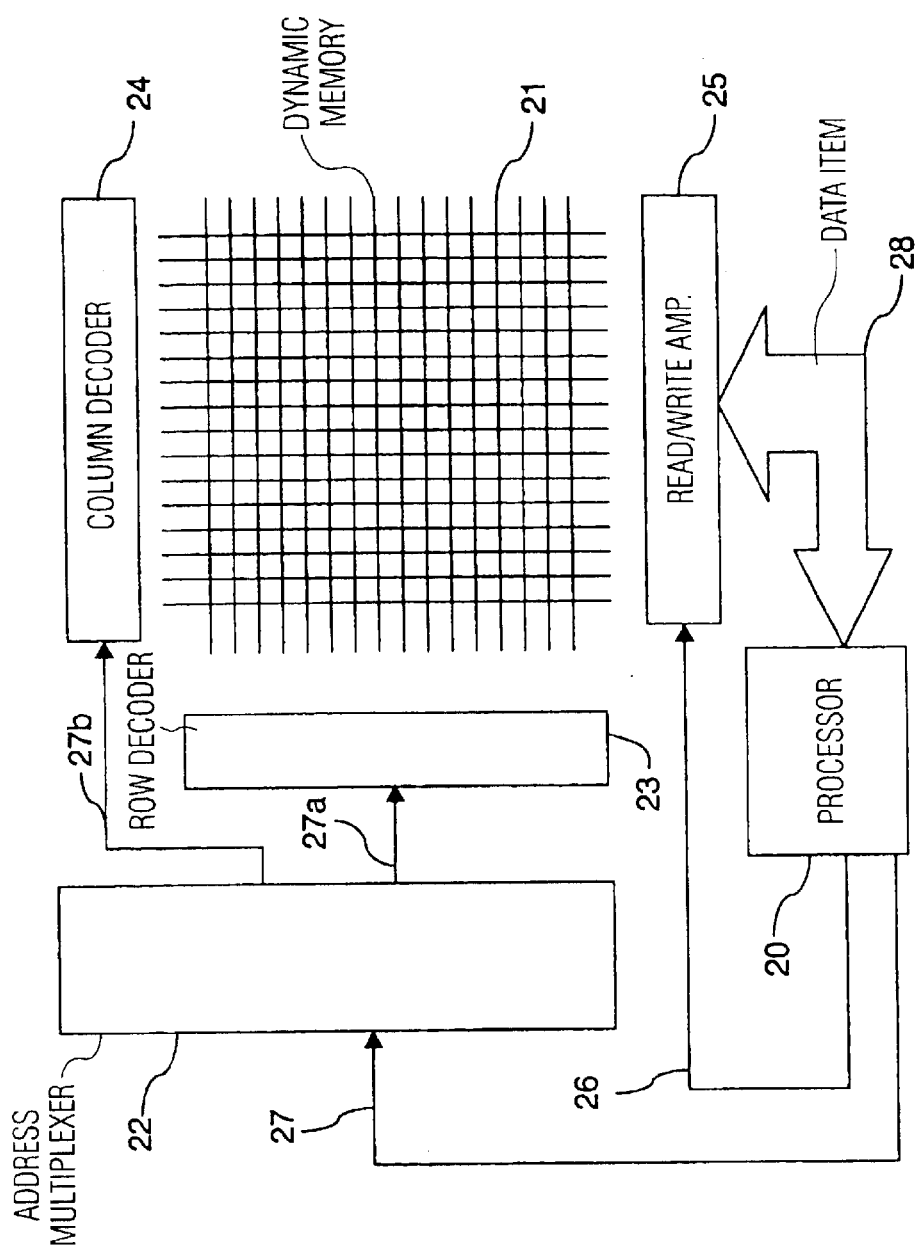
FIG. 2 illustrates an exemplary communication system architecture between a dynamic memory and a processor.

FIG. 2 illustrates an exemplary communication system architecture between a dynamic memory and a processor. Such a communication system comprises a processor 20, a dynamic memory 21, an address multiplexer 22, a row decoder 23, a column decoder 24 and a read and write amplifier 25. When the processor 20 wishes to read or write a data item 28 from or to the dynamic memory 21, it sends an address signal 27 to the address multiplexer 22 indicating the complete address in the dynamic memory 21 of the data item 28 to be read or written. A write or read control signal 26 generated by the processor 20 is sent to the read and write amplifier 25 so as to indicate whether the data item 28 is to be read or written.

The dynamic memory 21 is organized in the form of a grid of L rows and C columns, L and C being integers, not necessarily equal, of the order of a few hundred, which are generally powers of 2. A unit for storing one data bit, which will be more precisely described in FIG. 3, corresponds to each node of the grid, formed by an interconnection between a row and a column. The set, consisting of a row number and a column number constitutes a memory address. Consequently, a data bit corresponds to a memory address. When the processor 20 wishes to read a data bit, it sends the address signal 27 to the address multiplexer 22. This address signal 27 contains the row number and the column number of the relevant data bit. Additionally, the processor 20 sends the control signal 26 to the read and write amplifier 25, indicating that the operation performed on the relevant bit is a read. The address multiplexer 22 divides the address signal 27 into two parts. The high-order bits of the address signal 27 contain the row number of the relevant data bit, while the low-order bits contain the column number. A signal 27a is then sent to the row decoder 23, specifying the row number of the relevant data bit, and a signal 27b is then sent to the column decoder 24 specifying the column number of the relevant data bit. The relevant data bit is then loaded into the read and write amplifier 25, then sent to the processor. It should be noted that the functioning described hereinabove could exhibit variants depending on the type of dynamic memory used. Specifically, it is possible to load the entire row corresponding to the signal 27a into the read and write amplifier 25, then to select the relevant data bit by virtue of the signal 27b. Additionally, it is possible to group together, on one and the same row, several bits, so as to form words, for example, words of 8 bits. To read one of these words, the processor 20 will have to specify, in the address signal 27, the row number of the relevant word as well as the order of the word in this row. The principle of the writing of a data bit to the dynamic memory 21 is similar. In this case, the control signal 26 indicates that the operation performed on the relevant bit is a write. The relevant data bit is loaded into the read and write amplifier 25, then written to the dynamic memory 21 at the address specified by the address signal 27. It should be noted that this description applies to a dynamic memory of 1-bit type, that is to say, which can store a single-data bit at each of its nodes. Dynamic memories also exist which can store several bits at each of their nodes, for example, dynamic memories of 4-, 8- or 16-bit types. For these memories, the principle differs little from that described hereinabove, a memory address corresponding to a word of 4, 8 or 16 bits depending on the dynamic memory used. In this case, only words of several bits can be read or written by the processor 20.

Figure 3:
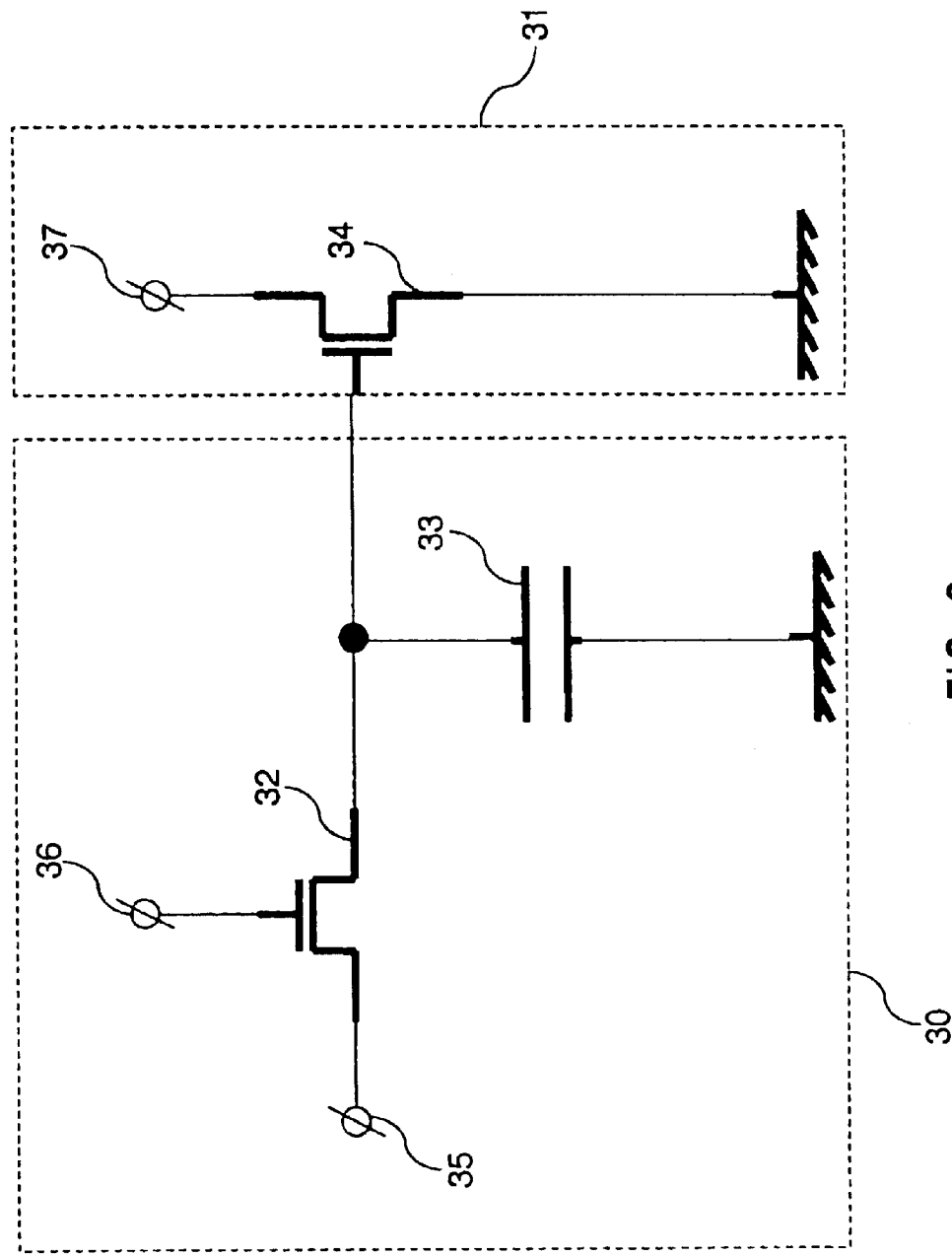
FIG. 3 illustrates the principle of writing and of reading a data item to and from a dynamic memory.

FIG. 3 illustrates the principle of the writing and the reading of a data item to or from a dynamic memory. A storage unit 30 comprises a first transistor 32, a capacitor 33, a write point 35 and a selection point 36. A read unit 31 comprises a second transistor 34 and a read point 37. The dynamic memory 21 comprises a storage unit 30 at each of its nodes. Each storage unit 30 stores a data bit in the form of an electric charge. To do this, it uses a capacitive effect specific to certain semiconductor devices, for example, a gate substrate capacitance of the first transistor 32. The storage unit 30 is installed on a silicon wafer, and a terminal of the first transistor 32 is insulated from the wafer by a thin non-conducting deposition, thereby forming a capacitance, represented by the capacitor 33. This capacitor 33 is capable of being charged, hence of "memorizing" a voltage applied to the first transistor 32. The charged or discharged state of the capacitor 33 makes it possible to distinguish two states, which correspond to two distinct values of the bit stored in the storage unit 30, 0 or 1. However, the capacitance of the capacitor 33 is so small that a charge cannot be preserved thereon for more than a limited duration, called the retention time, thereby explaining the need for the refresh. The functioning of the storage unit 30 is as follows. The first transistor 32 serves as a switch and is "on" when a voltage is applied to the selection point 36, that is, when the storage unit 30 is selected, for example, when the processor 20 wishes to write a data bit to this storage unit 30. When the processor 20 wishes to write a data bit of value 1 to the storage unit 30, it applies a voltage to the write point 35 so as to charge the capacitor 33. When the processor 20 wishes to write a data bit of value 0 to the storage unit 30, it applies a voltage to the write point 35 in such a way as to discharge the capacitor 33. The functioning of the read unit 31 is as follows. When the processor 20 wishes to read the data item stored in the storage unit 30, it measures the voltage at the read point 37, which is substantially equal to the voltage across the terminals of the capacitor 33. If this voltage corresponds to the charged state of the capacitor 33, the bit stored in the storage unit 30 equals 1, otherwise, this bit equals 0.

Figure 4:
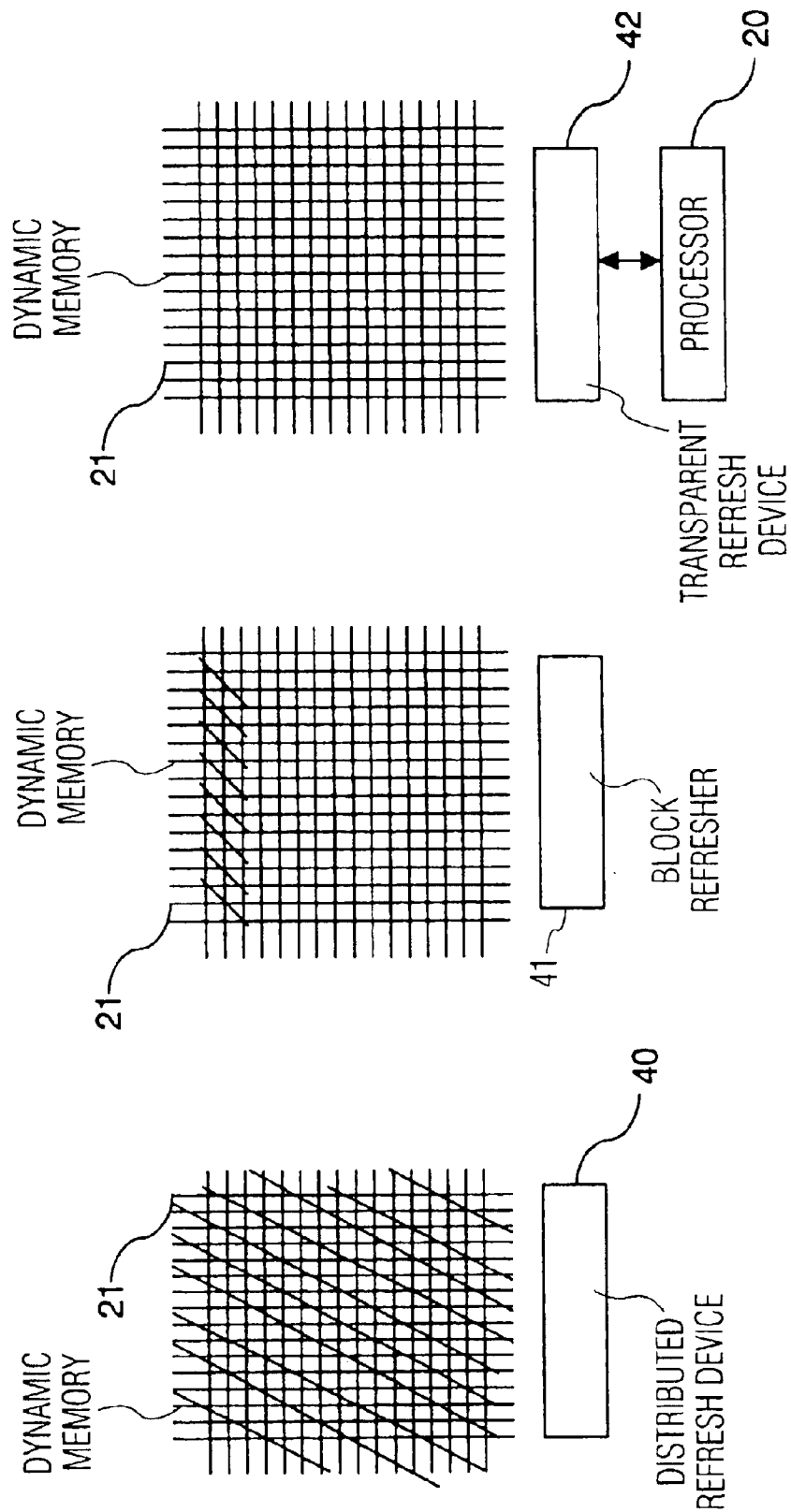
FIGS. 4a to 4c illustrate various types of refreshing of a dynamic memory according to the prior art.

FIGS. 4a to 4c illustrate various types of refreshing of a dynamic memory according to the prior art. FIG. 4a illustrates a device allowing distributed refreshing. Such a device comprises the dynamic memory 21 and a distributed refresh device 40. The distributed refresh device 40 performs the successive refreshing of all the rows of the dynamic memory 21, at regular time intervals. To do this, the distributed refresh device 40 uses a counter which measures the time which elapses between two refreshes. The drawback of distributed refreshing is that access to the dynamic memory 21 by the processor 20 is not possible during the refresh, thereby giving rise to substantial latency times. FIG. 4b illustrates a device allowing a refreshing of blocks. Such a device comprises the dynamic memory 21 and a device for refreshing blocks 41. The device for refreshing blocks 41 performs, at a given instant, the refreshing of a portion of the dynamic memory 21, for example, the portion hatched in the drawing. Here again, while this portion of the dynamic memory 21 being refreshed, the processor 20 does not have access to the corresponding data, and the latency time, even if it is less than the latency time due to distributed refreshing, remains substantial. FIG. 4c illustrates a device allowing transparent refreshing. Such a device comprises the dynamic memory 21, a transparent refresh device 42 and the processor 20. The transparent refresh device 42 performs the refreshing of the dynamic memory 21 when the processor does not need to access it. For such a refresh to be efficient, there must be sufficiently many periods in which the processor 20 does not access the dynamic memory 21. Now, the performance of current processors is such that they access the dynamic memory 21 almost continuously, thus rendering such a type of refreshing inefficient.

Figure 5:
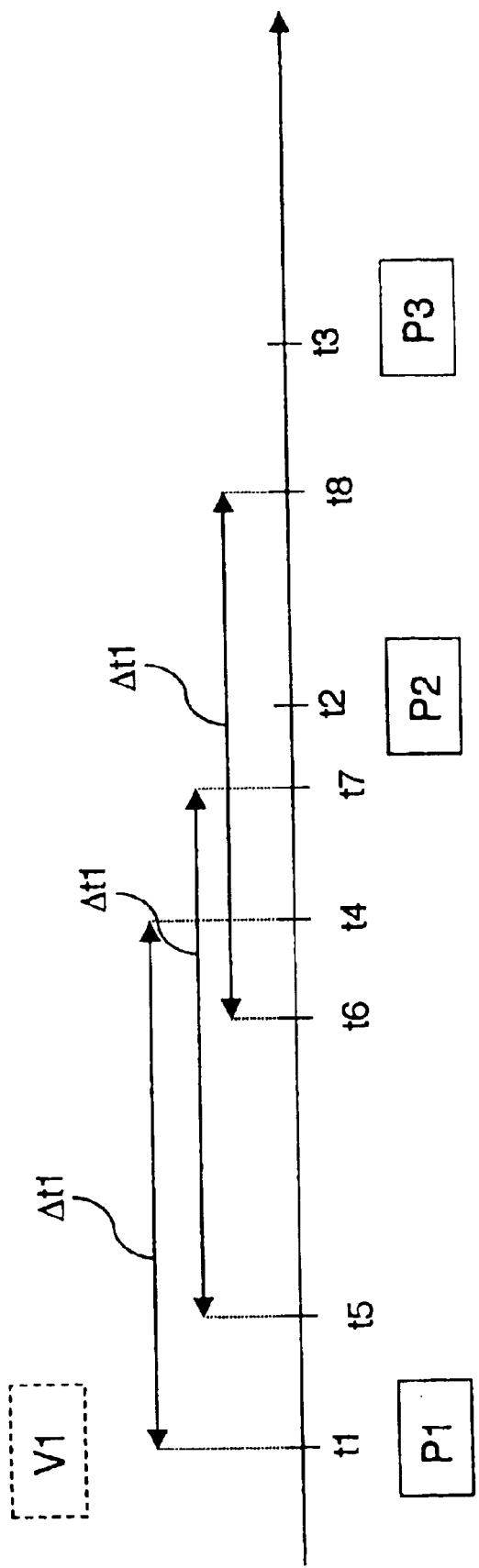
FIG. 5 illustrates a planning of operations performed by a processor as well as forecasting of instants at which a variable must be refreshed.

FIG. 5 illustrates an exemplary planning of operations performed by the processor 20 as well as a forecasting of the instants at which a variable must be refreshed. The processor 20 initiates a first process P1 onward of a first instant t1, a second process P2 onward of a second instant t2 and a third process P3 onward of a third instant t3. The first process P1 creates a variable V1, which must intervene in the second process P2 as well as in the third process P3. The retention time of the variable V1, that is, the duration onward of which this variable is no longer utilizable by the processor 20 if it is not refreshed, has a value $\Delta t1$.

In the absence of refreshing, the variable V1 is not longer utilizable onward of a fourth instant t4, such that $t4-t1 = \Delta t1$, which precedes the second instant t2. Now, the second process P2 must use the variable V1 at the second instant t2. It is therefore necessary to refresh the variable V1 between the first instant V1 and the fourth instant t4. As the refresh is performed by a reading of the variable V1 by the processor 20, by virtue of the reading device 31, it is judicious to perform this refresh when this reading device 31 is not used by the processor 20, so as not to add latency time. Let us assume that the reading device 31 is free at a fifth instant t5 and at a sixth instant t6, these two instants preceding the fourth instant t4. If the refreshing of the variable V1 is performed at the fifth instant t5, the variable V1 will no longer be utilizable onward of a seventh instant t7, such that $t7-t5=\Delta t1$, which precedes the second instant t2. A new refresh of the variable V1 will then be necessary before the seventh instant t7, and this will increase, in particular, the latency times and the consumption of current of the processor 20. This solution is, therefore, not judicious. However, if the refreshing of the variable V1 is performed at the sixth instant t6, variable V1 will no longer be utilizable onward of an eighth instant t8, such that $t8-t6=\Delta t1$, which follows the second instant t2. Consequently, the second process P2 will be able to use the variable V1 at the second instant t2. It is, therefore, judicious to refresh the variable V1 at the instant t6 at which the reading device 31 is not used by the processor 20, and satisfying the conditions:

$$t6 < t1 + \Delta t1$$

$$t6 + \Delta t1 > t2$$

To be used by the second process P2, the variable V1 is read at the second instant t2 by the processor 20, that is to say it is refreshed at the second instant t2. As the retention time $\Delta t1$ of the variable V1 is greater than the gap existing between the second instant t2 and the third instant t3, the third process P3 will be able to use the variable V1 at the third instant t3 without this requiring any refresh between the second instant t2 and the third instant t3.

If the three processes described hereinabove are defined in a program, it is possible to ascertain, when compiling this program, the order and the timing of the processes, the variables involved in these processes, the retention times of these variables, and the instants at which the read device 31 is used. It is then possible to forecast the instants at which these variables must be refreshed, in such a way as to decrease the latency times. Moreover, having ascertained the instants at which all the variables involved in the program have to be refreshed, it is possible to place the variables judiciously in the dynamic memory 21, so as to decrease the latency times. Thus, if, for example, all the variables which are to be refreshed at the same instant are placed on the same row, the refreshing of these variables will demand less time than if the variables in question are distributed randomly in the dynamic memory 21. Specifically, because the processor 20 then has to generate only a single signal 27, the refreshing of ten variables situated on the same row demands only a tenth of the time of the refreshing of ten variables situated on ten different rows.

Figure 6:
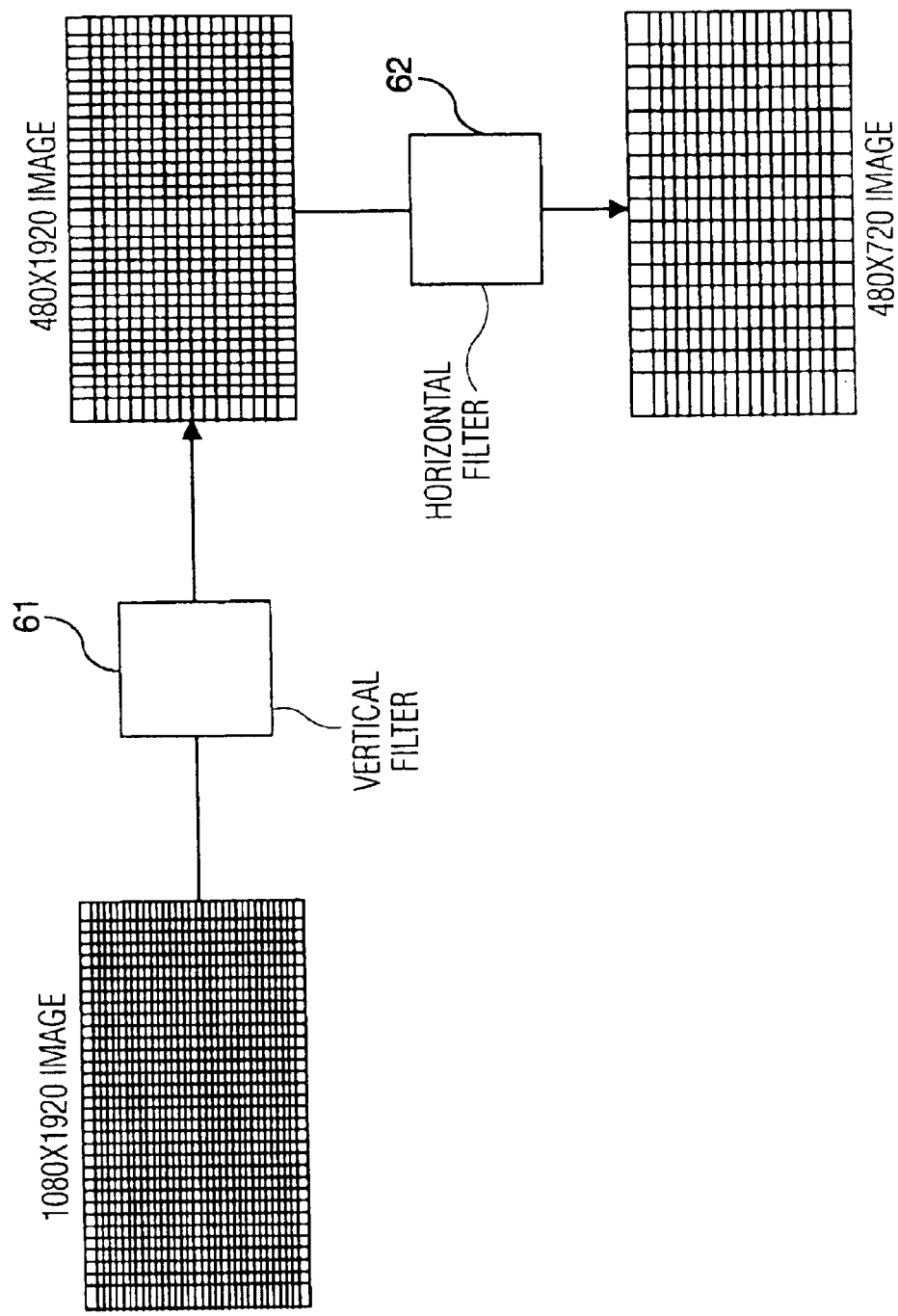
FIG. 6 illustrates an exemplary application of the invention in respect of video data processing.

FIG. 6 illustrates an application of the invention in a video data processing system. Such a system comprises a vertical filter 61 and a horizontal filter 62.

There are various formats for broadcasting video data. For example, an ATSC American digital television standard defines eighteen different broadcasting formats, such as, the standard format in which an image comprises 480 lines of 720 pixels each, or the high-definition format in which an image comprises 1080 lines of 1920 pixels each. When video data are broadcast in the high-definition format, it is necessary to convert them to the standard format so as to be able to view them on a television whose screen is not compatible with the high-definition format. The vertical filter 61 and the horizontal filter 62 make it possible to perform such a conversion. Each line of an image is stored in the form of a variable in a dynamic memory belonging to the vertical filter 61. The operations to be performed on these lines so as to convert 1080 lines of 1920 pixels into 480 lines of 1920 pixels constitute a part of a program. This program is complex, but the set of operations is defined from compilation of the program, thereby making it possible to implement the invention in respect of such a format conversion. The same holds for a program allowing the filter 62 to convert 480 lines of 1920 pixels into 480 lines of 720 pixels. Now, in such a video data processing system, around 30 images per second have to be converted from one format to another. Consequently, the various methods of refreshing according to the prior art would not make it possible to use dynamic memory in such a video data processing system, since the latency times would be too substantial. The invention, by making it possible to reduce the latency times related to refreshing, makes it possible to use dynamic memories, rather than static memories, in a video data processing system and, consequently, to decrease the cost of such a system.

The description hereinabove with reference to the FIGS. illustrates the invention rather than limiting it. Some remarks are made hereinbelow in this regard.

FIGS. 1, 5 and 6 illustrate an application of the invention which makes it possible to decrease the latency times for systems in which all the operations are known when compiling a program which defines them. It should be noted that the invention affords other advantages, such as, the decreasing of current consumption, as is mentioned in the description of FIG. 5. Therefore, it will be advantageous to implement the invention in certain systems, even if the real time constraints are not important, that is, even if the decrease in the latency time is not indispensable.

FIG. 5 explains the principle of the invention. The programs for which the invention is intended may be more complex, that is, involving a larger number of variables and processes. However, regardless of the complexity of the program, the invention can be implemented, provided it is possible to ascertain all the operations performed by the program during compilation of the latter. In this regard, FIG. 6 is merely one exemplary implementation of the invention, and it is, of course, possible to apply the invention to systems other than a video data processing system.

In principle, it is possible to implement the method according to the invention by means of a data processing device, for example, a suitably programmed integrated circuit. An instruction set contained in a programming memory can order the integrated circuit to perform the various steps described previously. The instruction set can be loaded into the program memory by reading a data medium such as, for example, a hard disk on which the instruction set is coded. The reading can be performed by way of a communication network such as, for example, the Internet. In this case, a service provider will make the instruction set available to the interested parties.

What is claimed is:

1. A method of refreshing a dynamic memory intended for storing variables involved in operations performed by a processor, said method comprising the steps:

planning an order and a timing of said operations thereby determining an instant at which an operation will be performed;

estimating a retention time specific to each variable;

forecasting at least one instant at which each variable must be refreshed, an instant at which a given variable must be refreshed being defined as a function of the retention time of said given variable and the timing of the operations in which said given variable is involved;

placing said variables in said memory; and refreshing said variables at the instants defined during the forecasting step.

2. The method of refreshing a dynamic memory as claimed in claim 1, wherein said steps of planning, estimating the retention time of each variable, placing and of forecasting are performed by the processor, during compilation of a program defining said operations.

3. The method of refreshing a dynamic memory as claimed in claim 1, wherein the refreshing of a variable is performed by the processor in response to a device for reading said variable.

4. The method of refreshing a dynamic memory as claimed in claim 3, wherein said method furthermore comprises a step of scheduling the instants at which sad reading device is capable of performing said refreshing step, said scheduling step being performed by the processor, during compilation of a program defining said operations.

5. A computer readable media having stored therein a computer program comprising program code instructions for executing the steps of a method of refreshing a dynamic memory intended for storing variables involved in operations performed by a processor when said program is executed on a computer, said method comprising the steps:

planning an order and a timing of said operations thereby determining an instant at which an operation will be performed;

estimating a retention time specific to each variable;

forecasting at least one instant at which each variable must be refreshed, an instant at which a given variable must be refreshed being defined as a function of the retention time of said given variable and the timing of the operations in which said given variable is involved;

placing said variables in said memory; and refreshing said variables at the instants defined during the forecasting step.

* * * * *